United States Patent
Boccadamo et al.

(10) Patent No.: US 9,306,436 B2
(45) Date of Patent: Apr. 5, 2016

(54) MINIATURE MOTOR AND HOUSING FABRICATION

(71) Applicant: MultiElectric GmbH & Co. KG, Stuttgart (DE)

(72) Inventors: Dario Boccadamo, Stuttgart (DE); Joachim Friebe, Weinstadt (DE)

(73) Assignee: MultiElectric GmbH & Co. KG, Stuttgart (DE)

( * ) Notice: Subject to any disclaimer, the term of this patent is extended or adjusted under 35 U.S.C. 154(b) by 422 days.

(21) Appl. No.: 13/776,259

(22) Filed: Feb. 25, 2013

(65) Prior Publication Data
US 2013/0241373 A1    Sep. 19, 2013

(30) Foreign Application Priority Data

Mar. 19, 2012 (DE) .......................... 10 2012 102 315

(51) Int. Cl.
| | |
|---|---|
| *H02K 15/16* | (2006.01) |
| *H02K 15/00* | (2006.01) |
| *H05K 5/03* | (2006.01) |
| *H02K 1/17* | (2006.01) |
| *H02K 15/03* | (2006.01) |
| *H02K 15/14* | (2006.01) |

(52) U.S. Cl.
CPC ................ *H02K 15/00* (2013.01); *H02K 1/17* (2013.01); *H02K 15/03* (2013.01); *H02K 15/14* (2013.01); *H05K 5/03* (2013.01); *H02K 2201/03* (2013.01); *Y10T 29/49009* (2015.01)

(58) Field of Classification Search
CPC .................................. H02K 15/00; H02K 1/17
USPC .............. 29/596–598, 732–736; 310/90, 184
See application file for complete search history.

(56) References Cited

U.S. PATENT DOCUMENTS

| | | | | |
|---|---|---|---|---|
| 3,422,295 A * | 1/1969 | Parker | ...................... | H02K 1/17 29/596 |
| 4,505,031 A * | 3/1985 | Colwell | ............... | H02K 5/1677 29/596 |
| 4,793,054 A * | 12/1988 | Abbratozzato | .......... | H02K 1/17 29/596 |
| 5,203,071 A * | 4/1993 | Niemela | .................. | H02K 1/17 29/463 |
| 6,058,594 A * | 5/2000 | Neumann | ................ | H02K 1/17 29/510 |
| 6,804,874 B2 * | 10/2004 | Niimi | ..................... | H02K 15/02 29/524 |
| 7,716,809 B2 * | 5/2010 | Miura | ..................... | H02K 1/17 29/421.1 |
| 2005/0223540 A1 * | 10/2005 | Krogen | .................. | H02K 15/02 29/596 |
| 2013/0229076 A1 * | 9/2013 | Boccadamo | ......... | H02K 5/1732 310/90 |
| 2013/0241373 A1 * | 9/2013 | Boccadamo | ........... | H02K 15/00 312/223.1 |
| 2013/0285496 A1 * | 10/2013 | Boccadamo | ......... | H02K 5/1672 310/90 |

FOREIGN PATENT DOCUMENTS

| | | |
|---|---|---|
| DE | 25 35 210 A1 | 2/1977 |
| JP | 2004 032 895 A | 1/2004 |
| JP | 2012 029 400 A | 2/2012 |

* cited by examiner

*Primary Examiner* — Minh Trinh
(74) *Attorney, Agent, or Firm* — Shlesinger, Arkwright & Garvey LLP

(57) ABSTRACT

Method for fabricating an electric miniature motor, substantially comprising a housing assembly, a rotor assembly, a power transmission and bearing assembly and a second bearing assembly, wherein the housing assembly comprises a housing tube having a division extending in the axial direction over an entire length of the housing tube, comprising the following steps of a) inserting a cylindrical core having a defined outer diameter into the housing assembly; b) adjusting an inner diameter of the housing assembly to an outer diameter of the core; c) fixing the inner diameter of the housing assembly by fixing the housing tube in an area of the division; and d) removing the cylindrical core.

9 Claims, 6 Drawing Sheets

MINIATURE MOTOR AND HOUSING FABRICATION

FIELD OF THE INVENTION

The present invention relates to electric miniature motors and a method for fabricating housings for those.

STATE OF THE ART

Nowadays, miniature motors are used in various applications. Those include drives in home appliances, hand tools, actuators in motor vehicles and the like. The demands imposed upon the motors by the applicants are steadily increasing, wherein a higher performance in conjunction with a lower deviation from the target values under the aspect of a cost-efficient fabricability is a focus.

Housings of miniature motors are frequently rolled from a sheet metal strip and secured against re-opening at the abutment of the two strip ends by correspondingly formed contours. The housing part in itself serves for seating the bearing shields, but it also provides the magnetic coupling for the magnetic flux induced by the permanent magnets arranged at the inner wall of the housing.

The difference between the inner diameter of the magnets inside the housing and the outer diameter of the rotor seated in the bearing shields mounted at the front sides of the housing tube forms the air gap the dimension of which in radial direction is decisive for the power generation of the motor.

A smaller air gap means a lower resistance for the magnetic flux and thus a better power efficiency. A low tolerance of the air gap reduces the power fluctuation range between different motor samples of the same construction.

Achieving a constantly small air gap requires small tolerances of the components used, and it is accompanied by a considerable cost effort, in particular in the fabrication of the housing tube and the permanent magnets.

Thus, the object of the present invention is to provide an electric miniature motor having a housing, wherein the air gap can be maintained in narrow limits without the requirement that the individual components have to have narrow tolerances regarding their radial dimensions.

It has now been found that this object can be achieved by the housing tube having a division in the axial direction enabling a diameter adaptation of the housing.

SHORT DESCRIPTION OF THE INVENTION

The object of the present invention is an electric miniature motor, wherein the housing is divided in the axial direction and which has a contour at the division enabling an adaptation of the inner diameter of the housing with the magnets mounted therein to a desired amount. After setting this amount, the housing is permanently fixed in this state.

SHORT DESCRIPTION OF THE FIGURES

Figure 1:
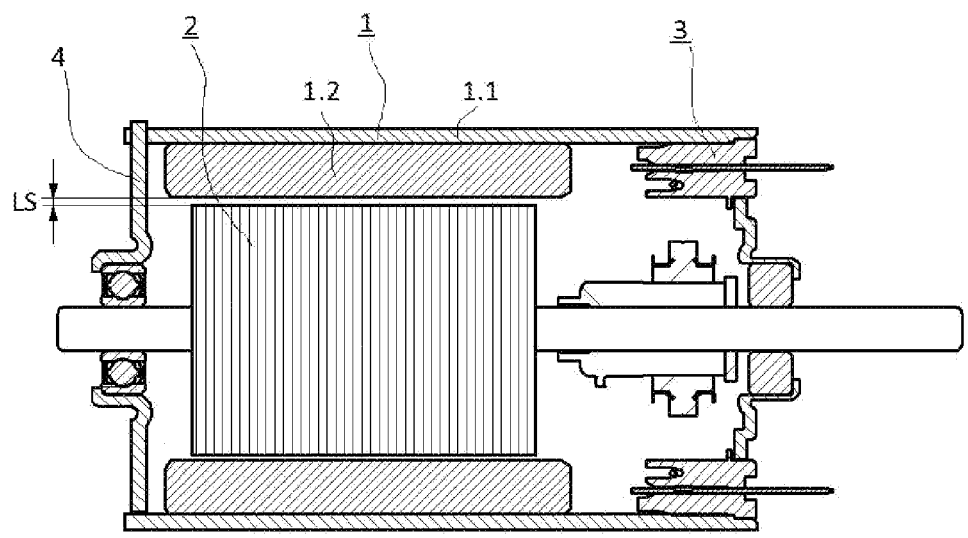
FIG. 1 illustrates a longitudinal section of a miniature motor having a tube-shaped housing with the common assemblies.
Figure 2:
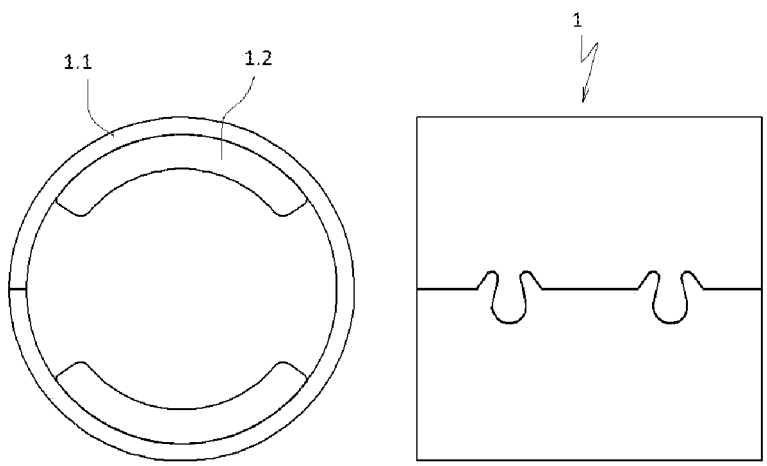
FIG. 2 illustrates the housing of a miniature motor in a tube-shaped configuration with the magnets of the prior art.
Figure 3:
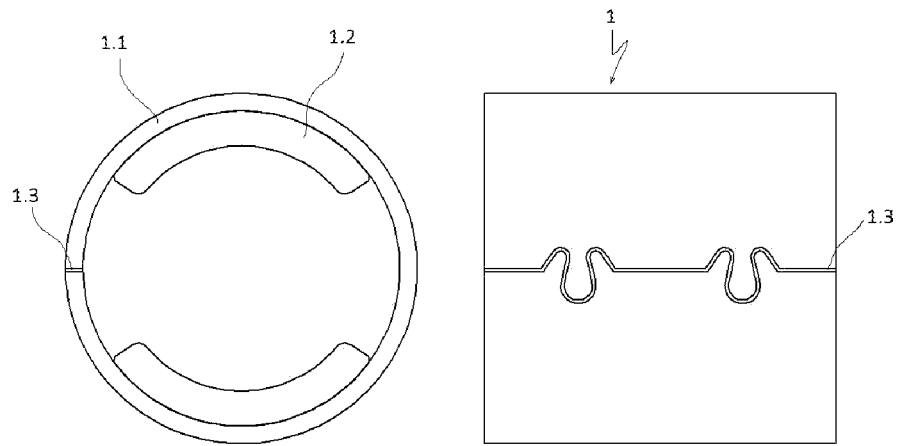
Figure 4:
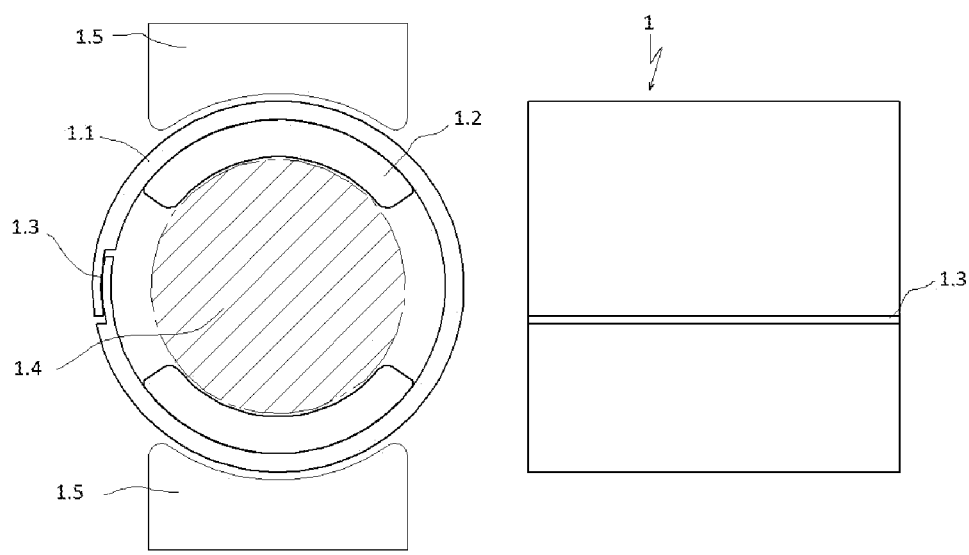
Figure 5:
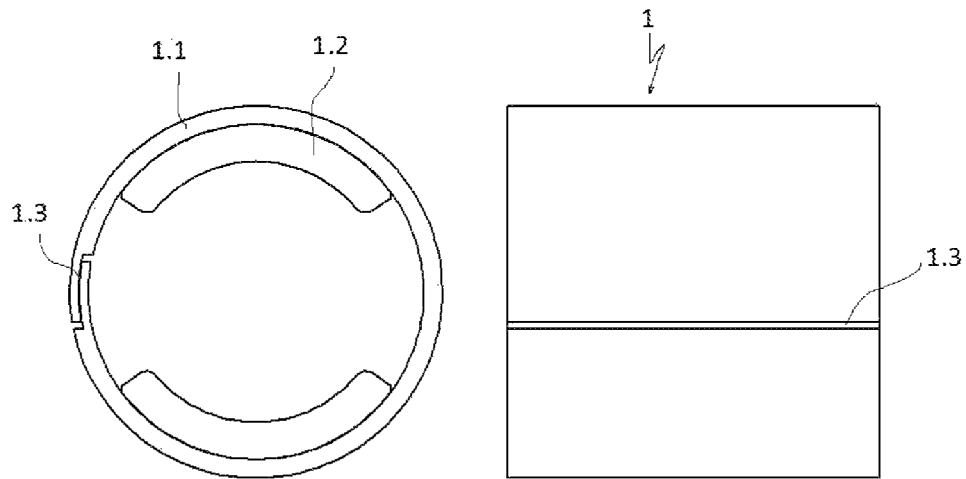
Figure 6:
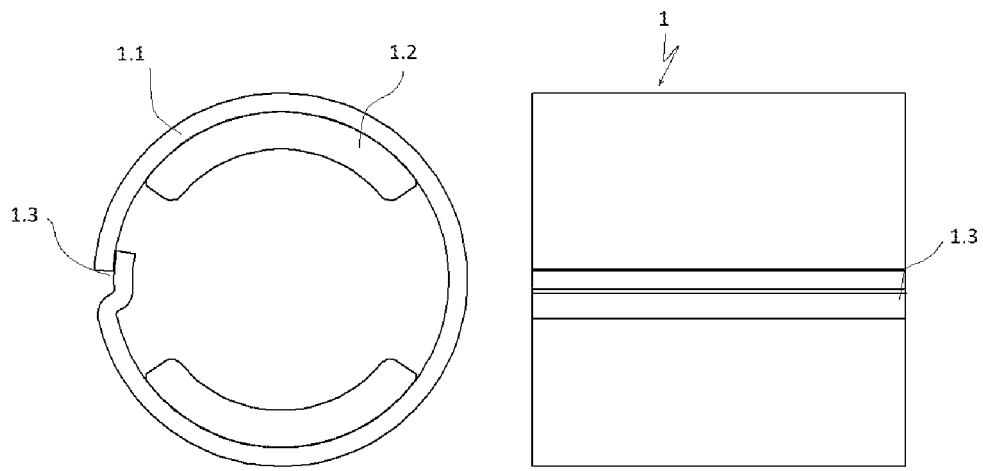
Figure 7:
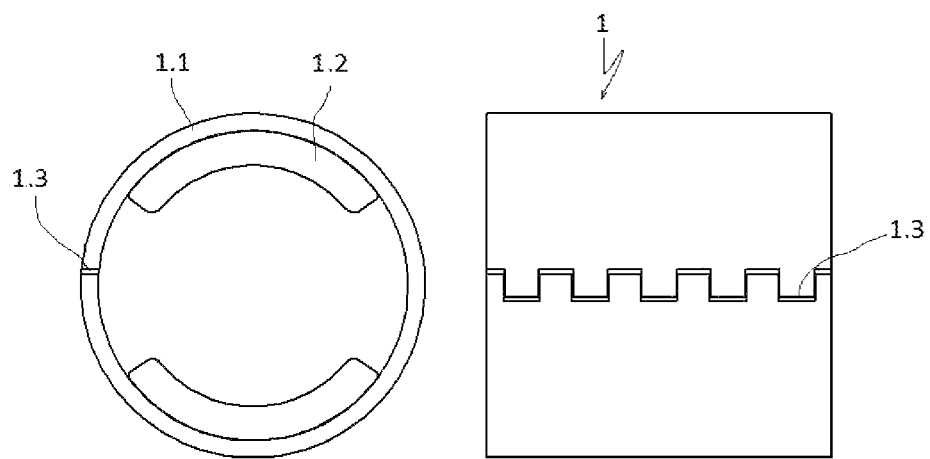
Figure 8:
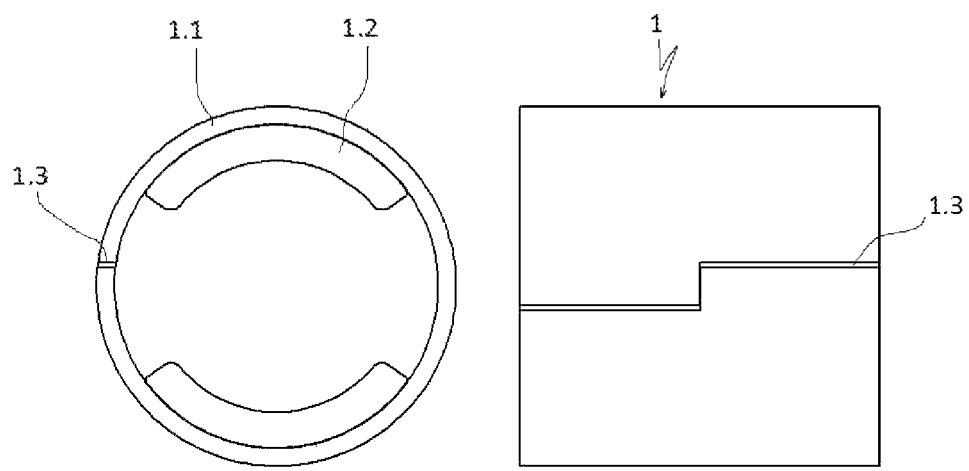
Figure 9:
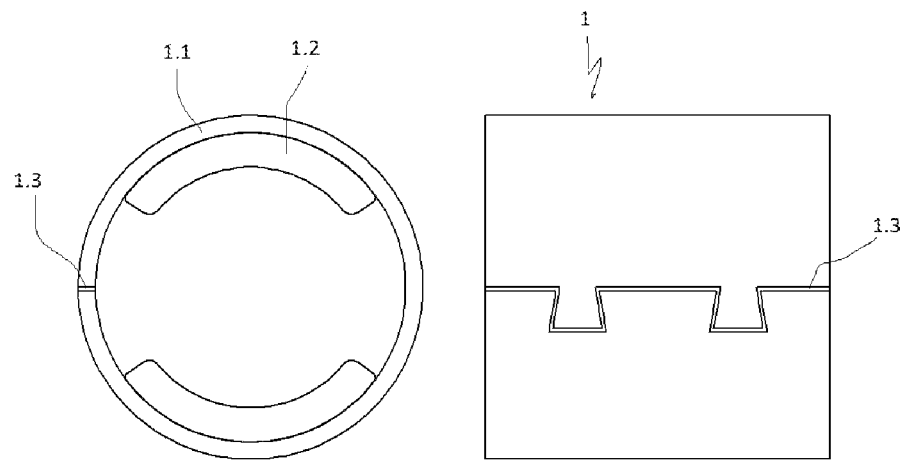
Figure 10:
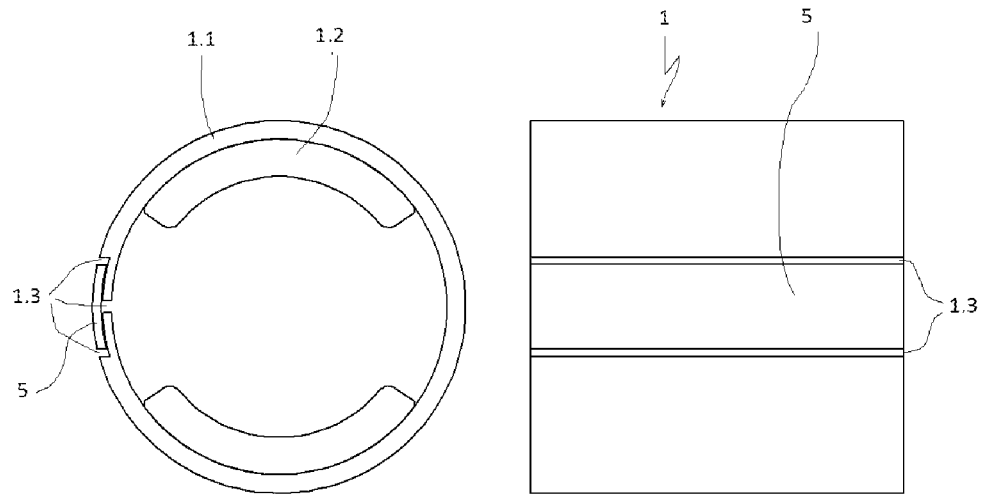
Figure 11:
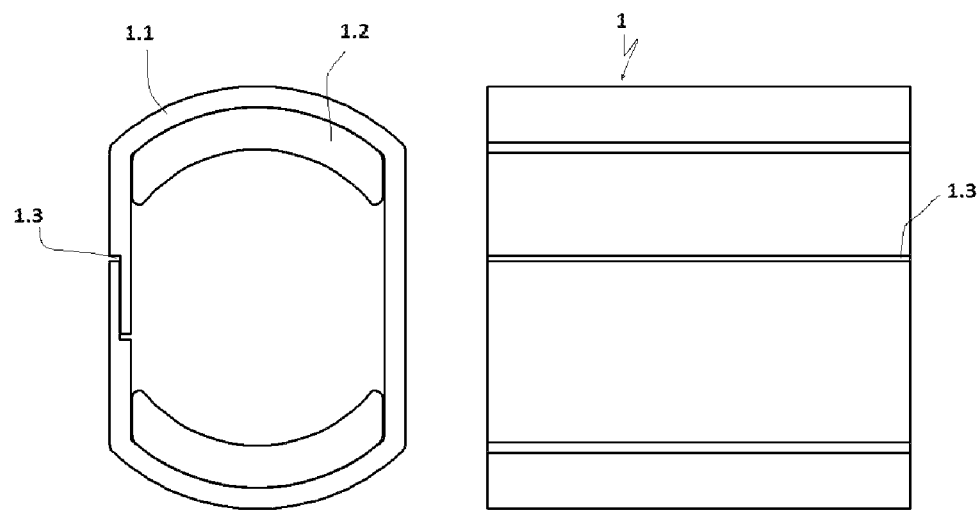

FIG. 3 is the housing of a miniature motor according to an embodiment of the invention with the housing tube 1.1, the magnets 1.2 and the division 1.3;

FIG. 4 illustrates the housing of a miniature motor according to the invention with the core 1.4 defining the inner diameter and outwardly acting pressure pieces 1.5;

FIGS. 5 to 9 illustrate further exemplary embodiments of the present invention;

FIG. 10 illustrates an embodiment according to the invention with an additional joint 5 at the housing tube 1.1;

FIG. 11 illustrates an embodiment according to the invention at a housing having flat sections.

DESCRIPTION OF THE INVENTION

A miniature motor according to the present invention substantially comprises a housing assembly 1, a rotor assembly 2 and a power transmission and bearing assembly 3 as well as a second bearing assembly 4. The components of these assemblies are sufficiently known from conventional motors and are thus only described here insofar as required for understanding the invention.

The housing assembly 1 comprises at least the housing tube 1.1 and the magnets 1.2 mounted at the inner wall of the housing tube 1.1 and generating the magnetic induction flux. Options for mounting the magnets 1.2 are adhesive processes as well as fixings by expansion springs, magnetic holders etc. or combinations of those which are nowadays commonly used in the construction of miniature motors.

The rotor assembly 2 which is supplied with power by the power transmission assembly 3 is received in the bearings of the motor.

The outer diameter of the rotor 2 and the inner diameter of the magnets 1.2 yield the air gap LS, the radial dimension of which has a decisive contribution upon the overall magnetic resistance of the magnetic circuit of the motor comprising the rotor 2, the magnets 1.2 and the housing tube 1.1. Reducing the air gap LS increases the power efficiency of the motor and thus its effectiveness. Further, the same dimension of the air gap LS over all motors of one constructional size is desired in order to minimize the fluctuation range of the power of individual motors.

The rotor 2 and the housing tube 1.1 can be cost-efficiently fabricated with sufficiently narrow tolerances of the outer diameter of the rotor 2 and the inner diameter of the housing tube 1.1. However, for process reasons, the radial thickness of the magnets 1.2 is subject to larger fabrication tolerances, for the reduction of which extensive post-processing, e.g. by grinding, is required. This post-processing makes a considerable contribution to the overall cost of the magnets 1.2.

The radial thickness of the magnets 1.2 thus has direct consequences upon the dimension of the air gap LS which however cannot be influenced anymore in the conventional configuration of the motors with a rigid housing and a predetermined rotor diameter.

According to the invention, this drawback is eliminated in that the housing tube 1.1 has a division 1.3 with a gap extending in the axial direction over the entire length of the housing tube 1.1. This division 1.3 allows to minimize the radial dimension of the air gap LS regardless of the fluctuation range of the radial thicknesses of the magnets 1.2 and to achieve a uniform radial dimension of the air gap LS within one series of motors.

As illustrated in FIG. 4, the housing tube 1.1 is arranged for this purpose with the magnets 1.2 already fixed therein over a core 1.4, and the inner diameter of the magnets 1.2 is brought to the measure of the outer diameter of the core 1.4 corresponding to the desired inner diameter of the housing assembly 1 in the assembled state of the motor by external, radially acting pressure pieces 1.5, for example. The housing tube 1.1 is fixed in this state, e.g. by welding (e.g. laser welding), soldering, gluing or a suitable mechanical deformation of housing sections in the area of the division 1.3. The fixation can occur pointwise, in sections or over the entire length of the division 1.3. The fixation can also be obtained by surrounding the housing tube 1.1 brought to the desired diameter by another component preventing a modification of the inner diameter of the housing tube 1.1. This can occur by insert molding or injection molding, for example, e.g. with a suitable plastic material. Thus, the housing tube 1.1 maintains its inner diameter even after withdrawing the pressure pieces 1.5 and removing the core 1.4.

The division 1.3 of the housing tube 1.1 is preferably arranged in the gap between the magnets 1.2 in order to avoid damaging the magnets 1.2 in the process of fixing the housing tube 1.1.

The application of the method according to the invention for adjusting the inner diameter of the magnets 1.2 in the housing tube 1.1 and thus the guaranteeing of an air gap LS remaining constant is not limited to motors having a circular cross-section but can also be applied to motors having flat portions at the housing as illustrated in FIG. 11.

Depending upon the requirements of the overall configuration of the housing and the motor, respectively, different configurations of the contour of the axial division 1.3 are possible which have in common, however, that they have a gap which enables a variation of the inner diameter of the magnets 1.2 in the housing tube 1.1 and the inner diameter of the housing assembly 1, respectively. Examples of such configurations are illustrated in FIGS. 3 to 9.

Another embodiment of the invention is exemplarily illustrated in FIG. 10, wherein an additional joint 5 which can also be contoured in an arbitrary manner adapted to the contour of the division 1.3 of the housing tube 1.1 itself is inserted for closing the gap in the housing tube 1.1 as illustrated in FIGS. 3 to 9.

The embodiment including the joint 5 can equally be applied to housings having flat portions such as in the housing illustrated in FIG. 11.

The invention claimed is:

1. Method for fabricating an electric miniature motor, substantially comprising a housing assembly, a rotor assembly, a power transmission and bearing assembly and a second bearing assembly, wherein the housing assembly comprises a housing tube having a division extending in an the axial direction over an entire length of the housing tube, comprising the following steps of:
   a) inserting a cylindrical core having a defined outer diameter into the housing assembly with magnets already mounted at an inner wall of the housing tube, the magnets including an inner diameter defining an inner diameter of the housing assembly;
   b) adjusting the inner diameter of the housing assembly to the outer diameter of the core;
   c) fixing the inner diameter of the housing assembly by fixing the housing tube in an area of the division; and
   d) removing the cylindrical core.

2. Method according to claim 1, wherein the housing assembly includes a housing center and the adjusting of the inner diameter of the housing assembly to the outer diameter of the cylindrical core is performed by forces acting in a direction of the housing center upon the outer diameter of the housing assembly.

3. Method according to claim 2, wherein the forces acting in the direction of the housing center are generated by pressure pieces.

4. Method according to claim 1, wherein the fixing of the housing tube is carried out by welding.

5. Method according to claim 4, wherein the fixing of the housing tube is carried out by laser welding.

6. Method according to claim 1, wherein the fixing of the housing tube is carried out by gluing.

7. Method according to claim 1, wherein the fixing of the housing tube is carried out by mechanically deforming the housing.

8. Method according to claim 1, wherein the fixing of the housing tube is carried out by soldering.

9. Method according to claim 1, wherein the fixing of the housing tube is performed by insert molding or injection molding with a plastic material.

\* \* \* \* \*